United States Patent
Rahim

(10) Patent No.: US 9,077,331 B1
(45) Date of Patent: Jul. 7, 2015

(54) HARMONIC DISTORTION REDUCTION IN CONTINUOUS TIME FILTERS

(71) Applicant: Maxim Integrated Products, Inc., San Jose, CA (US)

(72) Inventor: Chowdhury F. Rahim, Saratoga, CA (US)

(73) Assignee: MAXIM INTEGRATED PRODUCTS, INC., San Jose, CA (US)

( * ) Notice: Subject to any disclaimer, the term of this patent is extended or adjusted under 35 U.S.C. 154(b) by 0 days.

(21) Appl. No.: 14/068,623

(22) Filed: Oct. 31, 2013

Related U.S. Application Data

(60) Provisional application No. 61/839,592, filed on Jun. 26, 2013.

(51) Int. Cl.
| | |
|---|---|
| H03L 5/00 | (2006.01) |
| H03K 5/00 | (2006.01) |
| H03K 12/00 | (2006.01) |
| H01L 21/66 | (2006.01) |

(52) U.S. Cl.
CPC ............... H03K 12/00 (2013.01); H01L 22/14 (2013.01)

(58) Field of Classification Search
USPC .................................. 327/317, 551, 362, 552
See application file for complete search history.

(56) References Cited

U.S. PATENT DOCUMENTS

| | | | | |
|---|---|---|---|---|
| 6,906,585 B2 * | 6/2005 | Weldon | ........................ | 330/149 |
| 7,323,935 B2 * | 1/2008 | Yang et al. | ..................... | 330/258 |
| 8,224,266 B2 * | 7/2012 | Liu et al. | ..................... | 455/114.3 |

OTHER PUBLICATIONS

U.S. Appl. No. 61/839,592, filed Jun. 26, 2013, Chowdhury.
Roberto Alini, Rinaldo Castello et al, "Tunable BiCMOS Continuous-Time Filter for High-Frequency Applications", JSSC, Dec. 1992, pp. 1905-1915.
José Silva-Martinez, Michel S. J. Steyaert, W. Sansen, A Large-Signal Very Low-Distortion Transconductor for High-Frequency Continuous-Time Filters, JSSC, Jul. 1991, pp. 946-955.
Dominique Python, Christian Enz, "A 2V Low-Distortion CMOS Biquadratic Cell", ISCAS 1998, pp. I-139-I-142.
F. Rezzi, R. Castello et al, "Novel Linearization Circuit for BiCMOS Transconductors used in High Frequency OTA-C Filters", ISCAS 1993, pp. 1132-1135.
Donghyun Kim, Boris Murmann et al, "A Continuous-Time, Jitter Insensitive EΔ Modulator using a Digitally Linearized Gm-C Integrator with Embedded SC Feedback DAC", Symposium on VLSI Circuits Digest of Technical Papers, 2011, pp. 38-39.
Y. Tsividis, Z. Czarnul et al, "MOS Transconductors and Integrators with High Linearity", Electronics Letters, Feb. 27, 1986, vol. 22, No. 5, pp. 245-246.
Ko-Chi Kuo, Adrian Leuciuc, "A Linear MOS Transconductor Using Source Degeneration and Adaptive Biasing", 1992, pp. 937-943.

* cited by examiner

*Primary Examiner* — Dinh Le

(57) ABSTRACT

An integrated circuit (IC) includes first and second circuits. The first circuit is manufactured using a process, has an input and an output, and has a first nonlinearity. The second circuit is manufactured using the process, has a first terminal connected to the output of the first circuit and a second terminal connected to the input of the first circuit, and has a second nonlinearity. The second nonlinearity (i) is equal and opposite to the first nonlinearity and (ii) cancels the first nonlinearity.

14 Claims, 4 Drawing Sheets

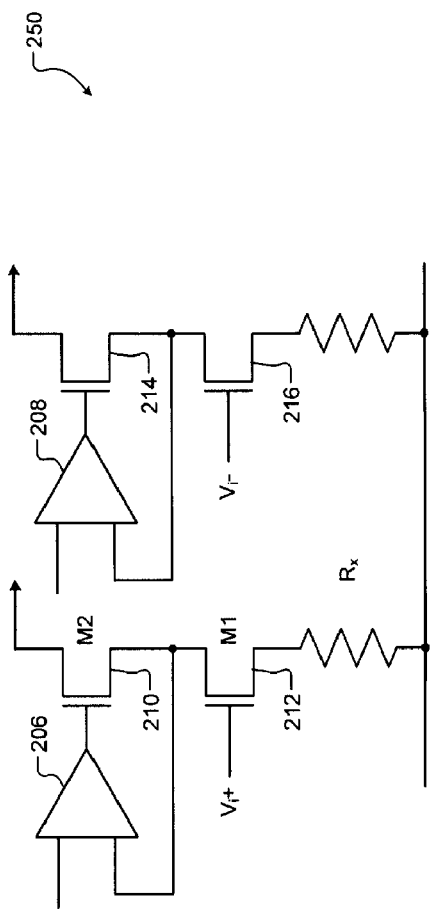
FIG. 4
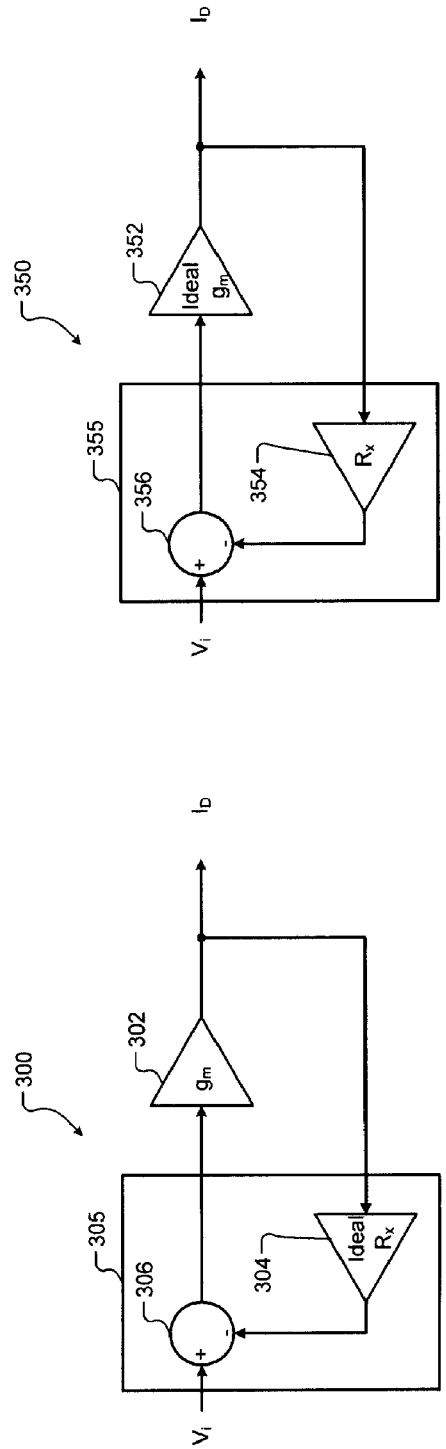
FIG. 5
FIG. 6

HARMONIC DISTORTION REDUCTION IN CONTINUOUS TIME FILTERS

CROSS-REFERENCE TO RELATED APPLICATIONS

This application claims the benefit of U.S. Provisional Application No. 61/839,592, filed on Jun. 26, 2013. The entire disclosure of the application referenced above is incorporated herein by reference.

FIELD

The present disclosure relates generally to integrated circuits and more particularly to harmonic distortion reduction in continuous time filters used with data converters in integrated circuits.

BACKGROUND

The background description provided here is for the purpose of generally presenting the context of the disclosure. Work of the presently named inventor, to the extent it is described in this background section, as well as aspects of the description that may not otherwise qualify as prior art at the time of filing, are neither expressly nor impliedly admitted as prior art against the present disclosure.

Many storage and communication devices use analog front-end circuits for signal processing. For example, in storage devices, such as magnetic disk drives and optical disc drives, read channels use analog front-end circuits to read and write data on storage mediums. In communication devices, transmitters and receivers use analog front-end circuits to transmit and receive signals.

The analog front-end circuits typically include data converters such as analog-to-digital converters and digital-to-analog converters. For example, in storage devices, analog-to-digital converters are used to convert data that is read from a storage medium from analog to digital format, and digital-to-analog converters are used to convert data that is to be written on the storage medium from digital to analog format. In communication devices, analog-to-digital converters are used to convert data that is received via a communication medium from analog to digital format, and digital-to-analog converters are used to convert data that is to be transmitted via the communication medium from digital to analog format.

Filters such as anti-aliasing filters and smoothing filters are often used in conjunction with data converters. For example, continuous time filters may be used to filter signals that are input to analog-to-digital converters and to filter signals output by digital-to-analog converters. The continuous time filters typically include discrete components and operational amplifiers designed using bipolar and/or field-effect transistors. These filters cannot be easily integrated with data converters in an integrated circuit using a single process due to considerations of cost, power consumption, and programmability. Further, harmonic distortion cannot be reduced below a certain limit in these filters due to nonlinearities of components used to manufacture these filters.

SUMMARY

An integrated circuit (IC) comprises first and second circuits. The first circuit is manufactured using a process, has an input and an output, and has a first nonlinearity. The second circuit is manufactured using the process, has a first terminal connected to the output of the first circuit and a second terminal connected to the input of the first circuit, and has a second nonlinearity. The second nonlinearity (i) is equal and opposite to the first nonlinearity and (ii) cancels the first nonlinearity.

In other features, the first circuit has a transconductance, and the second circuit has a resistance.

In other features, the first circuit includes a first metal-oxide semiconductor (MOS) device that operates in a non-saturation region, and the second circuit includes a resistance or a second MOS device that operates in a linear region.

In other features, the second circuit has a resistance, and a value of the resistance is selected based on the process to cancel a predetermined harmonic from the output of the first circuit.

In other features, a resistance of the second circuit is a function of an operating parameter of the IC, and the IC further comprises a sensing circuit that senses the operating parameter of the IC, and a control module that selects a value of the resistance of the second circuit based on the operating parameter of the IC, where the value of the resistance is selected to cancel a predetermined harmonic from the output of the first circuit.

In another feature, the operating parameter of the IC includes the process, a power supply, or a temperature of the IC.

In other features, the IC further comprises a filter that includes the first and second circuits and an integrator, that filters an input signal, and that generates an output signal; and an analog-to-digital converter that is manufactured using the process and that generates digital data based on the output signal.

In other features, the IC further comprises a digital-to-analog converter that is manufactured using the process, that converts digital data, and that generates an output signal; and a filter that includes first and second circuits and an integrator and that filters the output signal.

In still other features, a method comprises observing a first nonlinearity of a first circuit manufactured using a process, where the first circuit has an input and an output; and selecting a second circuit that is manufactured using the process and that has a second nonlinearity that is equal and opposite to the first nonlinearity, where the second circuit has first and second terminals. The method further comprises manufacturing an integrated circuit including the first and second circuits using the process. The first and second terminals of the second circuit are respectively connected to the output and the input of the first circuit. The second nonlinearity (i) is equal and opposite to the first nonlinearity and (ii) cancels the first nonlinearity.

In other features, the first circuit has a transconductance, and the second circuit has a resistance.

In other features, the first circuit includes a first metal-oxide semiconductor (MOS) device, and the second circuit includes a resistance or a second MOS device, and the method further comprises operating the first MOS device in a non-saturation region and operating the second MOS device in a linear region.

In another feature, the method further comprises selecting a value of a resistance of the second circuit based on the process to cancel a predetermined harmonic from the output of the first circuit.

In other features, a resistance of the second circuit is a function of an operating parameter of the integrated circuit, and the method further comprises sensing the operating parameter of the integrated circuit, and selecting a value of the resistance of the second circuit based on the operating parameter of the integrated circuit, where the value of the resistance is selected to cancel a predetermined harmonic from the output of the first circuit.

In another feature, the operating parameter of the integrated circuit includes the process, a power supply, or a temperature of the integrated circuit.

In other features, the method further comprises filtering an input signal using a filter comprising the first and second circuits and an integrator to generate an output signal, and generating digital data based on the output signal using an analog-to-digital converter manufactured using the process.

In other features, the method further comprises generating an output signal by converting digital data using a digital-to-analog converter manufactured using the process, and filtering the output signal using a filter comprising the first and second circuits and an integrator.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 4 is a schematic of a portion of a continuous time filter comprising a transconductance element and a degeneration element;

FIG. 5 depicts a feedback configuration comprising a nonlinear device having a transconductance and an ideal degeneration element;

FIG. 6 depicts a feedback configuration comprising an ideal device having a transconductance and a nonlinear degeneration element;

In the drawings, reference numbers may be reused to identify similar and/or identical elements.

DETAILED DESCRIPTION

Figure 1:
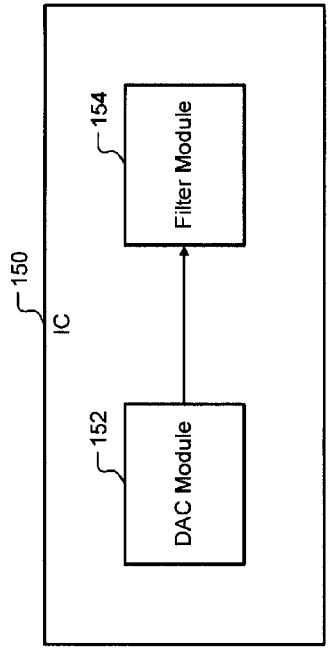
FIG. 1 is a functional block diagram of an integrated circuit comprising a filter module and an analog-to-digital converter module.

The present disclosure relates to systems and methods used to improve linearity of fully integrated continuous time filters. Continuous time filters typically include devices having a transconductance (e.g., MOS devices, operational amplifiers, and so on) and an integrator. Typically, the linearity of continuous time filters depends on the nonlinearity of the devices. The nonlinearity of the devices can be compensated or canceled as follows.

A degeneration element (e.g., a degeneration resistor) having nonlinearity equal and opposite to the nonlinearity of the device having a transconductance is connected to the device as a feedback circuit. The feedback circuit functions as a subtractor. Due to the feedback of equal and opposite nonlinearity, the output of the degeneration element is effectively subtracted from the input of the device to cancel the nonlinearity of the device. Thus, the nonlinearity of the device can be compensated by an equal and opposing nonlinearity of another circuit such as a degeneration element used as a feedback circuit.

The nonlinearity of the degeneration element, however, may vary due to various factors. For example, the factors may include process variations and variations in power supply, temperature, and so on of the integrated circuit. Hereinafter, these factors are collectively referred to as operating parameters or environment of the integrated circuit. Consequently, the value at which the degeneration element exhibits the desired nonlinearity (i.e., nonlinearity sufficient to cancel the nonlinearity of the device) may be different at different operating parameters.

Accordingly, the value of the degeneration element can be varied when one or more operating parameters of the integrated circuit vary so that the degeneration element exhibits the desired nonlinearity regardless of variations in the operating parameters. For example, the degeneration element can include a programmable, digitally controlled potentiometer. An on-chip sensing circuit may sense a change in an operating parameter of the integrated circuit. A control module for determining optimum feedback (i.e., nonlinearity of the feedback circuit) can be self-contained in the integrated circuit. Depending on the change in the operating parameter, the control module changes the value (e.g., resistance) of the feedback circuit at which the nonlinearity of the feedback circuit is sufficient to cancel the nonlinearity of the device.

Specifically, the systems and methods of the present disclosure can compensate for the nonlinearity of the device by infusing a sufficient nonlinearity of opposite polarity to cancel a predetermined harmonic (e.g., the third harmonic) from the output of the device. Additionally, the systems and methods can digitally calibrate the nonlinearity of the degeneration element to compensate for variations in the nonlinearity of the degeneration element due to changes in the operating parameters of the integrated circuit. Accordingly, the systems and methods can increase dynamic range of fully integrated continuous time filters by lowering the harmonic distortion in the continuous time filters.

Referring now to FIG. 1, an integrated circuit (IC) 100 includes a filter module 102 and an analog-to-digital converter (ADC) module 104. The filter module 102 includes a continuous time filter designed according to the present disclosure. The filter module 102 filters an input signal and outputs a filtered signal that is input to the ADC module 104. The ADC module 104 converts the filtered signal from analog to digital format. The filter module 102 and the ADC module 104 are manufactured using a single process.

Figure 2:
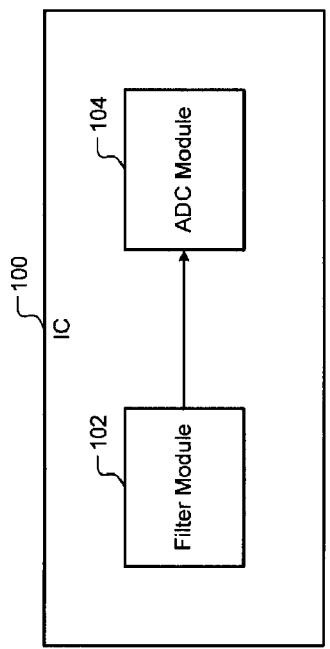
FIG. 2 is a functional block diagram of an integrated circuit comprising a digital-to-analog converter module and a filter module.

Referring now to FIG. 2, an integrated circuit (IC) 150 includes a digital-to-analog converter (DAC) module 152 and a filter module 154. The filter module 154 includes a continuous time filter designed according to the present disclosure. The DAC module 152 converts an input signal from digital to analog format. The filter module 102 filters the analog signal output by the DAC module 152 and outputs a filtered signal. The DAC module 152 and the filter module 154 are manufactured using a single process.

Figure 3:
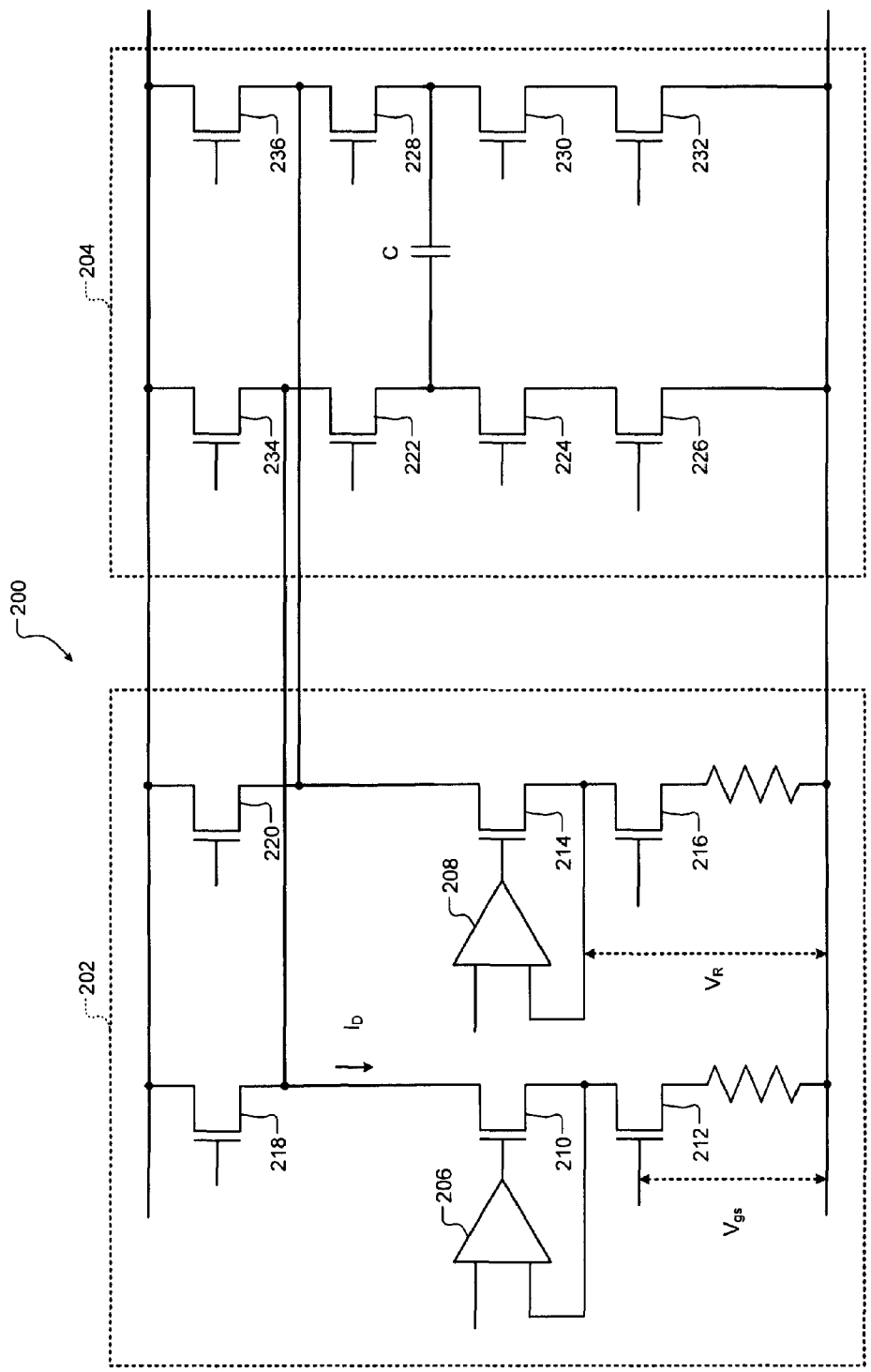
FIG. 3 is a schematic of a continuous time filter.

Referring now to FIG. 3, a continuous time filter 200 according to the present disclosure is shown. The continuous time filter 200 includes a $G_m$-C integrator. Specifically, the continuous time filter 200 includes a transconductor portion 202 and an integrator portion 204. The transconductor portion 202 includes amplifiers 206 and 208, transistors 210-216, and cascode transistors 218 and 220 connected as shown. The integrator portion 204 includes transistors 222-232, a capacitance C, and cascode transistors 234 and 236 connected as shown. The continuous time filter 200 uses a folded cascode configuration for example only. Alternatively, the continuous time filter 200 may use other configurations (e.g., telescopic cascode).

In the continuous time filter 200, the integrator portion 204 is decoupled from the transconductor portion 202. The drain current $I_d$ in the transconductor portion 202 can be controlled without affecting the bandwidth or dynamic range of the output of the continuous time filter 200. The transconductance $G_m$ of the transconductor portion 202 can be controlled by varying the gate voltage, the drain voltage, or the drain current. The output common mode voltage of the continuous time filter 200 can be changed independently of the input common mode voltage of the continuous time filter 200. The current in the output stage (i.e., the integrator portion 204) can be optimized to drive the load capacitance independently of the current in the input stage (i.e., the transconductor portion 202).

The nonlinearity in $G_m$-C circuits can be due to two components: the $G_m$ component (i.e., input MOS devices operating in non-saturation region or triode mode) and the capacitance component. The nonlinearity due to the capacitance component can be significantly reduced by using polysilicon-polysilicon (poly-poly) capacitors with thin oxide (thinox) dielectric, which have negligible voltage and temperature coefficients. Alternatively, depending on the process used, metal-insulator-metal (MIM) or metal-oxide-metal (MOM) capacitors with low voltage and temperature coefficients can also be used. Accordingly, the input MOS devices operating in triode mode are the dominant sources of nonlinearity in $G_m$-C circuits.

In other words, the linearity of the continuous time filter 200 is predominantly dependent on the linearity of the MOS devices operating in non-saturation region (i.e., in triode mode). The nonlinearity of the MOS devices causes harmonic distortion. Existing continuous time filters appear to have up to 60 dB total harmonic distortion. The most dominant harmonic distortion is usually the third harmonic. The desired total harmonic distortion, however, is an order of magnitude lower than 60 dB. By selecting a suitable nonlinear element as feedback circuit, the nonlinearity of the MOS devices can be compensated, and the desired third harmonic distortion can be achieved.

The design of a continuous time filter according to the present disclosure can be separated into two blocks: a linear memory block and a nonlinear memory-less block. The nonlinear memory-less block comprises an array of degenerated MOS devices operating in the triode mode.

Referring now to FIG. 4, a nonlinear memory-less block 250 of a continuous time filter is shown. A degeneration resistor $R_x$ is used as a linearizing element for example only. Alternatively, another MOS device operating in linear region may be used instead as a degeneration element. The degeneration resistor $R_x$ can improve the linearity of the MOS devices (M1 and M2). However, as the value of the degeneration resistor $R_x$ increases, the DC nonlinearity and distortion also increase. Instead, the degeneration resistor $R_x$ can be used in a feedback configuration as follows.

Referring now to FIG. 5, a feedback configuration 300 includes a device 302 having a transconductance and a degeneration resistor $R_x$ 304. The degeneration resistor $R_x$ 304 receives an output of the device 302 and effectively acts as a subtractor. A subtractor 306 is shown for illustrative purposes only and is in fact inherent in the degeneration resistor $R_x$ 304. The subtractor 306 subtracts the output of the degeneration resistor $R_x$ 304 from an input to the device 302. Accordingly, the degeneration resistor $R_x$ 304, which includes the function of the subtractor 306, may be referred to as a feedback circuit 305.

Suppose that the degeneration resistor $R_x$ 304 is ideal (i.e., linear) and that the device 302 is nonlinear. Suppose further, for example only, that the nonlinearity of the device 302 is predominantly due to the third harmonic. Any other harmonic (e.g., fifth, seventh, and so on) may be considered instead.

The drain current is given by $I_d = g_m/(1+g_m \cdot R_x)$. The drain current includes a fundamental component and a third harmonic component (in the example considered). That is, let $I_d = I_{d,fund} + I_{d,3rd\text{-}harm} = b_1 \cdot V_i + b_3 \cdot V_i^3$, where $b_1 = g_{m1}/(1+g_{m1} \cdot R_x)$, $b_3 = g_{m3}/(1+g_{m1} \cdot R_x)^4$, and $I_{d,fund} = [g_{m1}/(1+g_{m1} \cdot R_x)] \cdot V_i$. The third harmonic distortion is given by $HD_3 = [b_3/b_1^3] \cdot V_i^3/12 = [g_{m3}/(1+g_m \cdot R_x)] \cdot V_i^3/12$.

Referring now to FIG. 6, a feedback configuration 350 includes a device 352 having a transconductance and a degeneration resistor $R_x$ 354. The degeneration resistor $R_x$ 354 receives an output of the device 352 and effectively acts as a subtractor. A subtractor 356 is shown for illustrative purposes only and is in fact inherent in the degeneration resistor $R_x$ 354. The subtractor 356 subtracts the output of the degeneration resistor $R_x$ 354 from an input to the device 352. Accordingly, the degeneration resistor $R_x$ 354, which includes the function of the subtractor 356, may be referred to as a feedback circuit 355.

Suppose that the device 352 is ideal (i.e., linear) and that the degeneration resistor $R_x$ 354 is nonlinear. Suppose further, for example only, that the nonlinearity of the degeneration resistor $R_x$ 354 is predominantly due to the third harmonic. Any other harmonic (e.g., fifth, seventh, and so on) may be considered instead.

The drain current is given by $I_d = g_m/(1+g_m \cdot R_x)$. The drain current includes a fundamental component and a third harmonic component (in the example considered). That is, let $I_d = I_{d,fund} + I_{d,3rd\text{-}harm} = d_1 \cdot V_i + d_3 \cdot V_i^3$, where $d_1 = g_m/(1+g_m \cdot \alpha_1 R_x)$ and $\alpha_1$ = linear component of Rx, and $d_3 = -g_m^4 \alpha_3/(1+g_m \cdot \alpha_1 R_x)^4$ and $\alpha_3$ = third exponent of Rx. The third harmonic distortion is given by $HD_3 = (d_3/d_1^3) \cdot V_i^3/12 = (-\alpha_3 g_m)/(1+g_m \alpha_1 R_x) \cdot V_i^3/12$.

For weak nonlinearity of both the device with transconductance (gm) and the degeneration element (Rx, in this example), we can superpose such that $I_{d,fund} \cong g_m/(1+g_m \cdot R_x)$, $g_m \cong g_{m1}$. Therefore, $I_{d3rd\text{-}harm} = (b_3 + d_3) V_i^3$, where $b_3 = g_{m3}/(1+g_{m1} \cdot R_x)$, and $d_3 = -g_m \cdot \alpha_3/(1+g_m \cdot \alpha_1 R_x)$. Accordingly, the third harmonic (in the example considered) can be nulled by setting $|b3|=|d3|$. That is, the third harmonic can be nulled if the value of $R_x$ is selected such that $|b3|=|d3|$.

In other words, the harmonic distortion in a device due to a predetermined harmonic (e.g., third, fifth, seventh, and so on) can be nulled (i.e., canceled) by connecting a degeneration element (e.g., $R_x$ or a MOS device operating in linear region) having sufficient nonlinearity (e.g., equal and opposite nonlinearity as that of the device) in a feedback path of the device. The degeneration element can be selected from circuit components manufactured using the same process as that used to manufacture the data converter (e.g., ADC or DAC) and the device with transconductance. For example, a high-sheet-rolled-polysilicon resistor (or another MOS device operating in linear region) may be used as the degeneration element.

The DC linearity of the degeneration element may vary due to process variations and/or variations in one or more of power supply, temperature, and so on of the integrated circuit (collectively operating parameters or environment of the integrated circuit). For example, the normalized linearity of a high-sheet-rolled-polysilicon resistor may be zero when the resistance of the high-sheet-rolled-polysilicon resistor is approximately R1 ohms at temperature T1, R2 ohms at temperature T2, R3 ohms at temperature T2, and so on. The DC linearity of the degeneration element has a strong correlation with third harmonic distortion. Accordingly, the third harmonic can be nulled if the value (e.g., resistance) of the degeneration element can be digitally controlled based on the operating parameters of the integrated circuit.

An on-chip sensing circuit can detect and measure the variations in one or more operating parameters of the integrated circuit. For example, the variations may be detected and measured by sensing changes in a current, a voltage, a clock frequency, and so on utilized by a circuit in the integrated circuit. Based on the amount of change in an operating parameter (e.g., temperature) and from a known characteristic of the degeneration element, the sensing circuit can determine an amount of correction required to the value of the degeneration element to maintain the nonlinearity of the degeneration element. The sensing circuit can be self-contained and may determine the optimum value (e.g., resistance) of the degeneration element. The sensing circuit may determine the optimum value of the correction required on-chip, thereby obviating the need for a lookup table.

In some implementations, the variations in the operating parameters of the integrated circuit can be measured and the value of the degeneration element can be adjusted based on an event. For example, the adjustment may be triggered when a change in an operating parameter is greater than or equal to a predetermined threshold.

Figure 7:
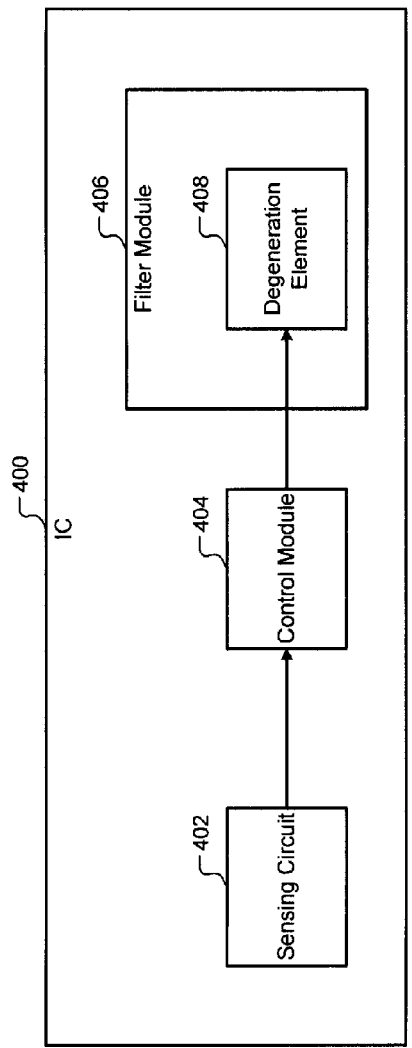
FIG. 7 is a functional block diagram of an integrated circuit comprising a sensing circuit and a continuous time filter.

Referring now to FIG. 7, an integrated circuit (IC) 400 includes a sensing circuit 402, a control module 404, and a filter module 406. In addition, the IC 400 may include a data converter and other processing elements depending on the application in which the IC 400 is used. The filter module 406 includes a degeneration element 408 used as a feedback circuit according to the present disclosure. For example, the degeneration element 408 may include a digitally controlled potentiometer.

The sensing circuit 402 senses the operating parameters (e.g., one or more of process, power supply, temperature and so on) of the IC 400. The control module 404 receives one or more of the operating parameters of the IC 400 from the sensing circuit 402 and sets the value of the degeneration element 408 such that the normalized linearity of the degeneration element 408 is zero.

Accordingly, in the filter module 406, the nonlinearity of the degeneration element 408 tracks the nonlinearity of the device having a transconductance at different operating conditions of the integrated circuit. Consequently, reduced harmonic distortion at a predetermined harmonic achieved by the degeneration element 408 can be maintained over a range of operating parameters of the integrated circuit regardless of variations in the operating parameters.

Figure 8:
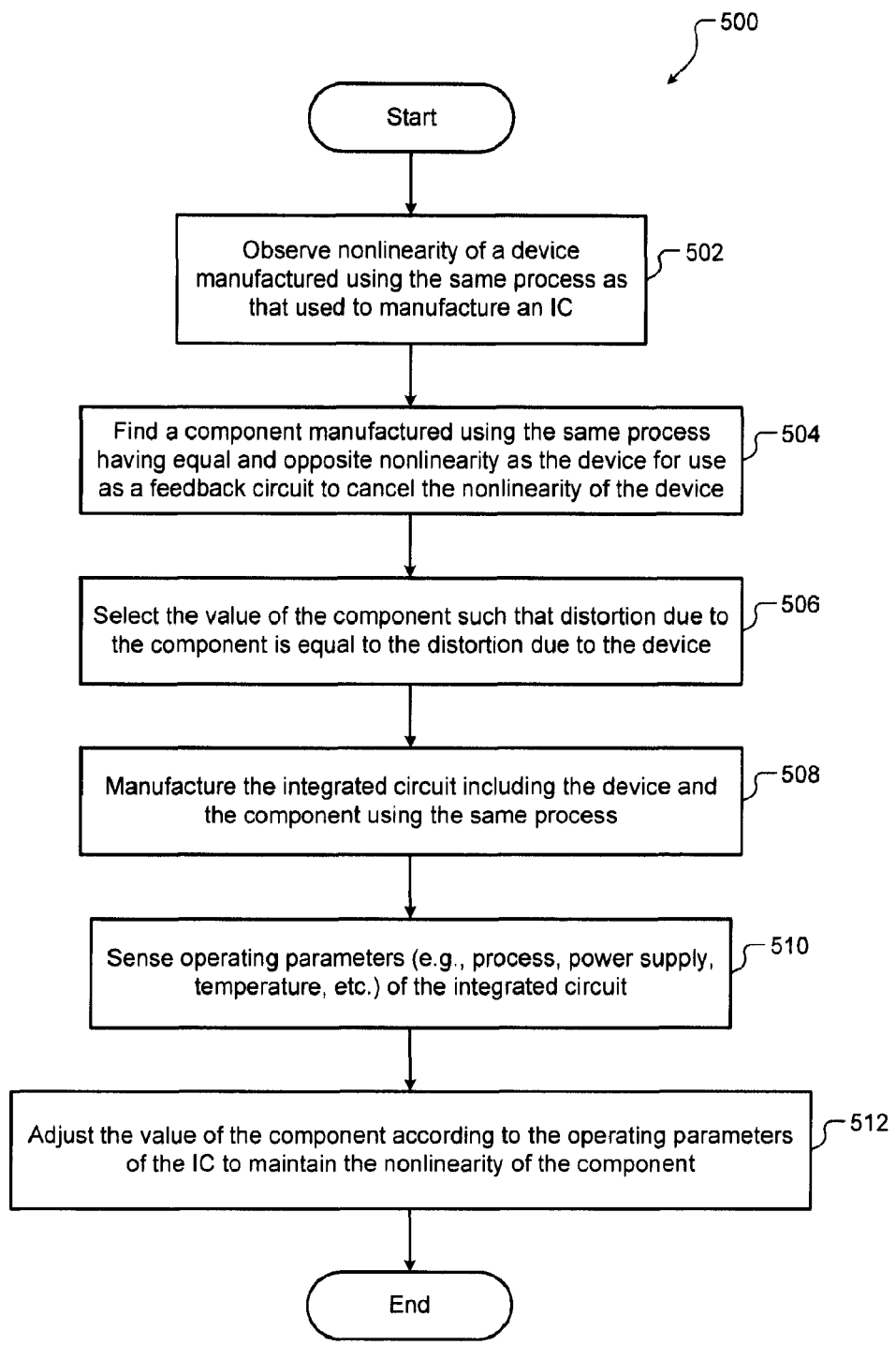
FIG. 8 is a flowchart of a method for reducing harmonic distortion and increasing linearity of a fully integrated continuous time filter.

Referring now to FIG. 8, a method 500 for reducing harmonic distortion and increasing the linearity of fully integrated continuous time filters by an order of magnitude according to the present disclosure is shown. At 502, the nonlinearity of a device having a transconductance is observed, where the device is manufactured using the same process as that used to manufacture an integrated circuit. At 504, a component manufactured using the same process and having equal and opposite nonlinearity as that of the device is identified for use as a feedback circuit to cancel the nonlinearity of the device. At 506, a value (e.g., resistance) of the component is selected such that, at a predetermined harmonic, the distortion due to the component is equal to the distortion due to the device.

At 508, the integrated circuit including the device and the component is manufactured using the same process. The component is connected as a feedback element to the device. For example, a first terminal of the component is connected to the output of the transconductance device, and a second terminal of the component is connected to the input of the transconductance device so that the output of the component is effectively subtracted from the input to the transconductance device.

At 510, one or more operating parameters (e.g., process, power supply, temperature, and so on) of the integrated circuit are sensed. At 512, the value of the component is adjusted according to the one or more operating parameters of the integrated circuit to maintain the nonlinearity of the component.

The systems and methods of the present disclosure are described using continuous time filter for example only. The systems and methods can be used to reduce harmonic distortion in other applications. For example, the systems and methods can be used to reduce harmonic distortion in continuous time Sigma Delta converters and other data converter applications. Additional examples of applications where the systems and methods can be used include analog front-ends for industrial and medical sensing applications.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A or B or C), using a non-exclusive logical OR. It should be understood that one or more steps within a method may be executed in different order (or concurrently) without altering the principles of the present disclosure.

In this application, including the definitions below, the term module may be replaced with the term circuit. The term module may refer to, be part of, or include an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor (shared, dedicated, or group) that executes code; memory (shared, dedicated, or group) that stores code executed by a processor; other suitable hardware components that provide the described functionality; or a combination of some or all of the above, such as in a system-on-chip.

The term code, as used above, may include software, firmware, and/or microcode, and may refer to programs, routines, functions, classes, and/or objects. The term shared processor encompasses a single processor that executes some or all code from multiple modules. The term group processor encompasses a processor that, in combination with additional processors, executes some or all code from one or more modules. The term shared memory encompasses a single memory that stores some or all code from multiple modules. The term group memory encompasses a memory that, in combination with additional memories, stores some or all code from one or more modules. The term memory may be a subset of the term computer-readable medium. The term computer-readable medium does not encompass transitory electrical and electromagnetic signals propagating through a medium, and may therefore be considered tangible and non-transitory. Non-limiting examples of a non-transitory tangible computer readable medium include nonvolatile memory, volatile memory, magnetic storage, and optical storage.

The apparatuses and methods described in this application may be partially or fully implemented by one or more computer programs executed by one or more processors. The computer programs include processor-executable instructions that are stored on at least one non-transitory tangible computer readable medium. The computer programs may also include and/or rely on stored data.

What is claimed is:

1. An integrated circuit (IC) comprising:
a first circuit that is manufactured using a process, that has an input and an output, and that has a first nonlinearity; and
a second circuit that is manufactured using the process, that has a first terminal connected to the output of the first circuit and a second terminal connected to the input of the first circuit, and that has a second nonlinearity,
wherein the second nonlinearity (i) is equal and opposite to the first nonlinearity and (ii) cancels the first nonlinearity, and
wherein a resistance of the second circuit is a function of an operating parameter of the IC, the IC further comprising:
a sensing circuit that senses the operating parameter of the IC; and
a control module that is coupled to the sensing circuit and the second circuit and that selects a value of the resistance of the second circuit based on the operating parameter of the IC,
wherein the value of the resistance is selected to cancel a predetermined harmonic from the output of the first circuit.

2. The IC of claim 1 wherein the first circuit has a transconductance, and wherein the second circuit has a resistance.

3. The IC of claim 1 wherein the first circuit includes a first metal-oxide semiconductor (MOS) device that operates in a non-saturation region, and wherein the second circuit includes a resistance or a second MOS device that operates in a linear region.

4. The IC of claim 1 wherein the second circuit has a resistance and wherein a value of the resistance is selected based on the process to cancel a predetermined harmonic from the output of the first circuit.

5. The IC of claim 1 wherein the operating parameter of the IC includes the process, a power supply, or a temperature of the IC.

6. The IC of claim 1 further comprising:
a filter that includes the first and second circuits and an integrator, that filters an input signal, and that generates an output signal; and
an analog-to-digital converter that is manufactured using the process and that generates digital data based on the output signal.

7. The IC of claim 1 further comprising:
a digital-to-analog converter that is manufactured using the process, that converts digital data, and that generates an output signal; and
a filter that includes first and second circuits and an integrator and that filters the output signal.

8. A method comprising:
observing a first nonlinearity of a first circuit manufactured using a process, wherein the first circuit has an input and an output;
selecting a second circuit that is manufactured using the process and that has a second nonlinearity that is equal and opposite to the first nonlinearity, wherein the second circuit has first and second terminals;
manufacturing an integrated circuit including the first and second circuits using the process, wherein the first and second terminals of the second circuit are respectively connected to the output and the input of the first circuit, and wherein the second nonlinearity (i) is equal and opposite to the first nonlinearity and (ii) cancels the first nonlinearity,
wherein a resistance of the second circuit is a function of an operating parameter of the integrated circuit, the method further comprising:
sensing the operating parameter of the integrated circuit; and
selecting a value of the resistance of the second circuit based on the operating parameter of the integrated circuit,
wherein the value of the resistance is selected to cancel a predetermined harmonic from the output of the first circuit.

9. The method of claim 8 wherein the first circuit has a transconductance, and wherein the second circuit has a resistance.

10. The method of claim 8 wherein the first circuit includes a first metal-oxide semiconductor (MOS) device, and wherein the second circuit includes a resistance or a second MOS device, the method further comprising operating the first MOS device in a non-saturation region and operating the second MOS device in a linear region.

11. The method of claim 8 further comprising selecting a value of a resistance of the second circuit based on the process to cancel a predetermined harmonic from the output of the first circuit.

12. The method of claim 9 wherein the operating parameter of the integrated circuit includes the process, a power supply, or a temperature of the integrated circuit.

13. The method of claim 8 further comprising:
filtering an input signal using a filter comprising the first and second circuits and an integrator to generate an output signal; and
generating digital data based on the output signal using an analog-to-digital converter manufactured using the process.

14. The method of claim 8 further comprising:
generating an output signal by converting digital data using a digital-to-analog converter manufactured using the process; and
filtering the output signal using a filter comprising the first and second circuits and an integrator.

* * * * *